US011170317B2

(12) United States Patent
Chow et al.

(10) Patent No.: US 11,170,317 B2
(45) Date of Patent: Nov. 9, 2021

(54) PROCEDURE FOR SYSTEMATIC TUNE UP OF CROSSTALK IN A CROSS-RESONANCE GATE AND SYSTEM PERFORMING THE PROCEDURE AND USING RESULTS OF THE SAME

(71) Applicant: International Business Machines Corporation, Armonk, NY (US)

(72) Inventors: Jerry M. Chow, Yorktown Heights, NY (US); Jay M. Gambetta, Yorktown Heights, NY (US); Easwar Magesan, Yorktown Heights, NY (US); Sarah E. Sheldon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1033 days.

(21) Appl. No.: 15/455,470

(22) Filed: Mar. 10, 2017

(65) Prior Publication Data

US 2018/0225586 A1 Aug. 9, 2018

Related U.S. Application Data

(60) Provisional application No. 62/308,137, filed on Mar. 14, 2016.

(51) Int. Cl.
*G06N 10/00* (2019.01)
*H03K 19/195* (2006.01)
*B82Y 10/00* (2011.01)

(52) U.S. Cl.
CPC ......... *G06N 10/00* (2019.01); *H03K 19/1958* (2013.01); *B82Y 10/00* (2013.01)

(58) Field of Classification Search
CPC .... H03K 19/1958; B82Y 10/00; G06N 10/00; G06N 99/00
See application file for complete search history.

(56) References Cited

U.S. PATENT DOCUMENTS

2015/0324705 A1* 11/2015 Biercuk ................ G06F 3/0673
  711/101
2018/0013426 A1* 1/2018 Deurloo ............. H03K 19/1952

OTHER PUBLICATIONS

Sengupta et al., "Scalable Design of Tailored Soft Pulses for Coherent Control," in 95 Physical Rev. Letters 037202 (2005). (Year: 2005).*

(Continued)

*Primary Examiner* — Kamran Afshar
*Assistant Examiner* — Ryan C Vaughn
(74) *Attorney, Agent, or Firm* — Harrington & Smith

(57) ABSTRACT

In a system including a cross-resonance gate having a superconducting control qubit and having a superconducting target qubit coupled through a bus resonator, echo pulses are generated at a first frequency and directed to the control qubit, wherein the first frequency is on resonance with the control qubit. Cross-resonance pulses are generated at a second frequency on resonance with the target qubit and applied to the control qubit, wherein the generating and applying the cross-resonance pulses induce rotations on the target qubit through an interaction that is mediated by the bus resonator. Cancellation pulses are generated at the second frequency and applied to the target qubit. Sets of Hamiltonian tomographies may be measured to determine appropriate amplitudes and phases of the cross-resonance and cancellation pulses.

20 Claims, 12 Drawing Sheets

(56) References Cited

OTHER PUBLICATIONS

Ribeiro et al., "Robust Quantum Gates for a Singlet-Triplet Spin Qubit," in arXiv (2012). (Year: 2012).*
Saito et al., "Experimentally Realizable Controlled NOT Gate in a Flux Qubit/Resonator System," in 81 Physical Rev. B 134507 (2010). (Year: 2010).*
Cole, "Hamiltonian Tomography: The Quantum (System) Measurement Problem," in 17 New J. Physics 101001 (2015). (Year: 2015 ).*
Ware, "Flux-Tunable Superconducting Transmons for Quantum Information Processing," doctoral dissertation, Syracuse U. (2015). (Year: 2015).*
C. Rigetti et al.; "Fully microwave-tunable universal gates in superconducting qubits with linear couplings and fixed transition frequencies"; Physical Review B 81, 134507; 2010; whole document (7 pages).
J.M. Chow et al.; "A simple all-microwave entangling gate for fixed-frequency superconducting qubits"; Physical Review Letters 107, 80502; 2011; whole document (5 pages).
J.M. Chow et al.; "Implementing a strand of a scalable fault-tolerant quantum computing fabric"; Nature Communications 5, 4015; 2014; whole document (9 pages).
A.D. Córcoles et al.; "Detecting arbitrary quantum errors via stabilizer measurements on a sublattice of the surface code"; Nature Communications 6, 6979; 2015; whole document (12 pages).
E. Magesan et al.; "Efficient measurement of quantum gate error by interleaved randomized benchmarking" Physical Review Letters 109, 080505; 2014; whole document (5 pages).
J.M. Gambetta et al.; "Characterization of addressability by simultaneous randomized benchmarking"; Physical Review Letters 109, 240504; 2013; whole document (10 pages).
S. Sheldon et al.; "Characterizing errors on qubit operations via iterative randomized benchmarking"; Physical Review A 93, 012301; 2016; whole document (5 pages).
R. Barends et al.; "Logic gates at the surface code threshold: Superconducting qubits poised for fault-tolerant quantum computing"; Nature 508, 500-503; 2014; whole docment (15 pages).
L. Dicarlo et al.; "Demonstration of Two-Qubit Algorithms with a Superconducting Quantum Processor"; Nature 460, 240-244; 2009; whole document (9 pages).
A.O. Niskanen et al.; "Quantum Coherent Tunable Coupling of Superconducting Qubits"; Science 316; May 4, 2007; pp. 723-726.
E. Magesan et al.,; "Characterizing Quantum Gates via Randomized Benchmarking"; Physical Review A 85, 042311; 2012; whole document (19 pages).
R.C. Bialczak et al.; "Fast Tunable Coupler for Superconducting Qubits"; Physical Review Letters 106, 060501; 2011; whole document (4 pages).
P.C. De Groot et al.; "Selective darkening of degenerate transitions demonstrated with two superconducting quantum bits"; Nature Physics 6, 763; 2010; whole document (16 pages).
G.S. Paraoanu; "Microwave-induced coupling of superconducting qubits"; Physical Review B 74, 140504(R); 2008—whole document (6 pages).
H. Ball et al.; "The role of master clock stability in scalable quantum information processing"; arXiv:1602.04551v2 [quant-ph]; Aug. 15, 2016; whole document (9 pages).
D.C. McKay et al.; "A universal gate for fixed-frequency qubits via a tunable bus"; Physical Review Applied 6, 064007; 2016; whole document (10 pages).
S.R. Hartmann et al.; "Nuclear Double Resonance in the Rotating Frame"; Physical Review 128, 2042; Dec. 1, 1962; pp. 2042-2053.
M.H. Devoret et al.; "Superconducting Qubits: A Short Review"; arXiv:cond-mat/0411174; Oct. 11, 2004; whole document (41 pages).
Y. Chen et al.; "Qubit architecture with high coherence and fast tunable coupling"; Physical Review Letters 113, 220502; 2014; whole document (10 pages).
J. Majer et al.; "Coupling Superconducting Qubits via a Cavity Bus"; Nature 449, 443-447; Sep. 2007; whole document (6 pages).
J.A. Schreier et al.; "Suppressing Charge Noise Decoherence in Superconducting Charge Qubits"; Physical Reviev B 77, 180502(R); 2008; whole document (5 pages).
A.A. Houck et al.; "Controlling the spontaneous emission of a superconducting transmon qubit"; Physical Review Letters 101, 080502; 2008; whole document (4 pages).
A.D. Córcoles et al.; "Process verification of two-qubit quantum gates by randomized benchmarking"; Physical Review A 87, 030301(R); 2013; whole document (9 pages)
R. Barends et al.; "Coherent Josephson qubit suitable for scalable quantum integrated circuits"; Physical Review Letters 111, 080502; 2013; whole document (10 pages).
J. Koch et al.; "Charge insensitive qubit design derived from the Cooper pair box"; Physical Review A 76, 042319; 2007; whole document (21 pages).
D.J. Van Harlingen et al.; "Decoherence in Josephson-junction qubits due to critical-current fluctuations"; Physical Review B 70, 064517; 2004; whole document (13 pages).
J.P. Gaebler et al.; "Randomized Benchmarking of Multi-Qubit Gates"; Physical Review Letters 108, 260503; 2012; whole document (31 pages).
J.M. Chow; "Quantum Information Processing with Superconducting Qubits"; A Dissertation Presented to the Faculty of the Graduate School of Yale University; May 2010; whole document (322 pages).

* cited by examiner

PROCEDURE FOR SYSTEMATIC TUNE UP OF CROSSTALK IN A CROSS-RESONANCE GATE AND SYSTEM PERFORMING THE PROCEDURE AND USING RESULTS OF THE SAME

CROSS-REFERENCE TO RELATED APPLICATIONS

This application claims the benefit of U.S. Provisional Application No. 62/308,137, filed on Mar. 14, 2016, the disclosure of which is hereby incorporated by reference in its entirety.

GOVERNMENT RIGHTS

This invention was made with Government support under contract W911NF-14-1-0124 awarded by the Army Research Office. The Government has certain rights in this invention.

BACKGROUND

This invention relates generally to quantum computing and, more specifically, relates to cross-resonance (CR) gates in quantum computing.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations and acronyms used in this document and/or the drawings are defined below, prior to the claims.

The cross-resonance (CR) gate is an entangling gate for superconducting qubits that uses only microwave control (see C. Rigetti and M. Devoret, Phys. Rev. B 81, 134507 (2010); and J. M. Chow, et al., Phys. Rev. Lett. 107, 080502 (2011)) and has been the standard for multi-qubit experiments in superconducting architectures using fixed-frequency transmon qubits (see J. M. Chow, et al., Nature Communications 5, 4015 (2013), arXiv:1311.6330 [quant-ph]; and A. Corcoles, et al., Nature Communications 6 (2015), 10.1038/ncomms7979). Superconducting qubits arranged with shared quantum buses (see J. Majer, et al., Nature 449, 443 (2007)) allow qubit networks to be designed with any desired connectivity. This flexibility of design also translates into a flexibility of control and many choices in entangling gate implementations. The CR gate is one choice of two-qubit gates that uses only microwave control, as opposed to using magnetic flux drives to tune two qubits into a specific resonance condition to entangle, as in the controlled-phase gate (see R. Barends, et al., Nature 508, 500 (2014); and L. DiCarlo, et al., Nature 460, 240 (2009)), or to tune a coupler directly. For the latter, see the following: A. O. Niskanen, et al., Science 316, 723 (2007); R. C. Bialczak, at al., Phys. Rev. Lett. 106, 060501 (2011); Y. Chen, et al., Phys. Rev. Lett. 113, 220502 (2014); and D. C. McKay et al., Phys. Rev. Applied 6, 064007 (2016).

The CR gate requires a small static coupling of the qubit pair that slightly hybridizes the combined system and requires one additional microwave drive. The relatively low overhead of the CR scheme (the additional control line is combined with a single-qubit drive at room temperature) makes it an attractive gate for use in quantum computing architectures based on planar superconducting qubits. Additionally, the CR gate is well-suited to transmon qubits (see J. Koch, et al., Phys. Rev. A 76, 042319 (2007)), which have become the superconducting qubit of choice due to promising long coherence and lifetimes (see A. A. Houck, et al., Phys. Rev. Lett. 101, 080502 (2008); and R. Barends, et al., Phys. Rev. Lett. 111, 080502 (2013)), limited charge noise (see J. M. Gambetta, et al., Phys. Rev. Lett. 109, 240504 (2012)), and high single-qubit gate fidelities (see S. Sheldon, et al., Phys. Rev. A 93, 012301 (2016)). The microwave-only control allows the use of fixed-frequency transmons, further reducing the sources of possible noise (see D. J. Van Harlingen, et al., Phys. Rev. B 70, 064517 (2004)). Given all of these qualities, the CR gate has been a useful tool for application in multi-qubit experiments, including demonstrations of parity measurements required for the surface code (see J. M. Chow, et al., Nature Communications 5, 4015 (2014)).

Despite the appeal of the CR gate, its implementation has been hindered by slow gate times. The CR gate relies on an always-on qubit-qubit coupling, but large couplings can lead to crosstalk between qubits. This leads to a trade-off between fast, high-fidelity two-qubit gates and high-fidelity simultaneous single-qubit gates. As a result, typical CR gates between transmon devices have resulted in gate times >300:400 ns, with measured fidelities of 94-96% (see A. Corcoles, et al., Nature Communications 6 (2015), 10.1038/ncomms7979; and A. Corcoles, et al., Phys. Rev. A 87, 030301 (2013)).

BRIEF SUMMARY

This section is intended to include examples and is not intended to be limiting.

A method includes generating, in a system comprising a cross-resonance gate having a superconducting control qubit and having a superconducting target qubit coupled through a bus resonator, echo pulses at a first frequency and directing the echo pulses to the control qubit, wherein the first frequency is on resonance with the control qubit. The method also includes generating cross-resonance pulses at a second frequency on resonance with the target qubit and applying the cross-resonance pulses to the control qubit, wherein the generating and applying the cross-resonance pulses induce rotations on the target qubit through an interaction that is mediated by the bus resonator. The method further includes generating cancellation pulses at the second frequency and applying the cancellation pulses to the target qubit.

An apparatus comprises a system comprising a cross-resonance gate having a superconducting control qubit and having a superconducting target qubit coupled through a bus resonator. The apparatus further comprises system controller circuitry comprising one or more processors and one or more memories having computer readable code. The one or more processors, in response to retrieving and executing the computer readable code, cause the system to perform operations comprising: generating, in the system, echo pulses at a first frequency and directing the echo pulses to the control qubit, wherein the first frequency is on resonance with the control qubit; generating cross-resonance pulses at a second frequency on resonance with the target qubit and applying the cross-resonance pulses to the control qubit, wherein the generating and applying the cross-resonance pulses induce rotations on the target qubit through an interaction that is mediated by the bus resonator; and generating cancellation pulses at the second frequency and applying the cancellation pulses to the target qubit.

Another method comprises measuring, in a system comprising a cross-resonance gate having a superconducting control qubit and a superconducting target qubit coupled through a bus resonator, a first set of Hamiltonian tomographies, where cross-resonance pulses at a frequency on resonance with the target qubit are applied to the control qubit, and where Hamiltonian tomographies are measured at specific points as the cross-resonance pulses are swept from a beginning phase to an ending phase at a specific amplitude. The method also comprises determining, using output from the first set of first Hamiltonian tomographies, a phase to be used for cancellation pulses. The method further comprises measuring a second set of Hamiltonian tomographies by applying cross-resonance pulses at the frequency to the control qubit and applying cancellation pulses at the frequency and at the determined phase to the target qubit, where the cross-resonance pulses have a specific amplitude and a specific phase, where Hamiltonian tomographies are measured at specific points as an amplitude of the cancellation pulses is swept from a beginning amplitude to an ending amplitude. The method additionally comprises determining, using output from the second set of second Hamiltonian tomographies, an amplitude to be used for the cancellation pulses, and outputting the determined phase and amplitude for the cancellation pulses, to be used to configure the system for subsequent operations of the cross-resonance gate.

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Here we describe improvements to the CR gate through a careful Hamiltonian analysis and novel tune-up procedure that reduce the gate time by a factor of two with corresponding fidelities over 99% (as described below, e.g., in reference to FIG. 2). Our increased understanding of the CR Hamiltonian expands upon previous studies, which have primarily used a simple qubit model (see the following for the latter: C. Rigetti and M. Devoret, Phys. Rev. B 81, 134507 (2010); and G. S. Paraoanu, Phys. Rev. B 74, 140504 (2006)). We show that such models are incomplete and do not fully capture the dynamics of the complete two transmon qubit system.

Figure 1A:
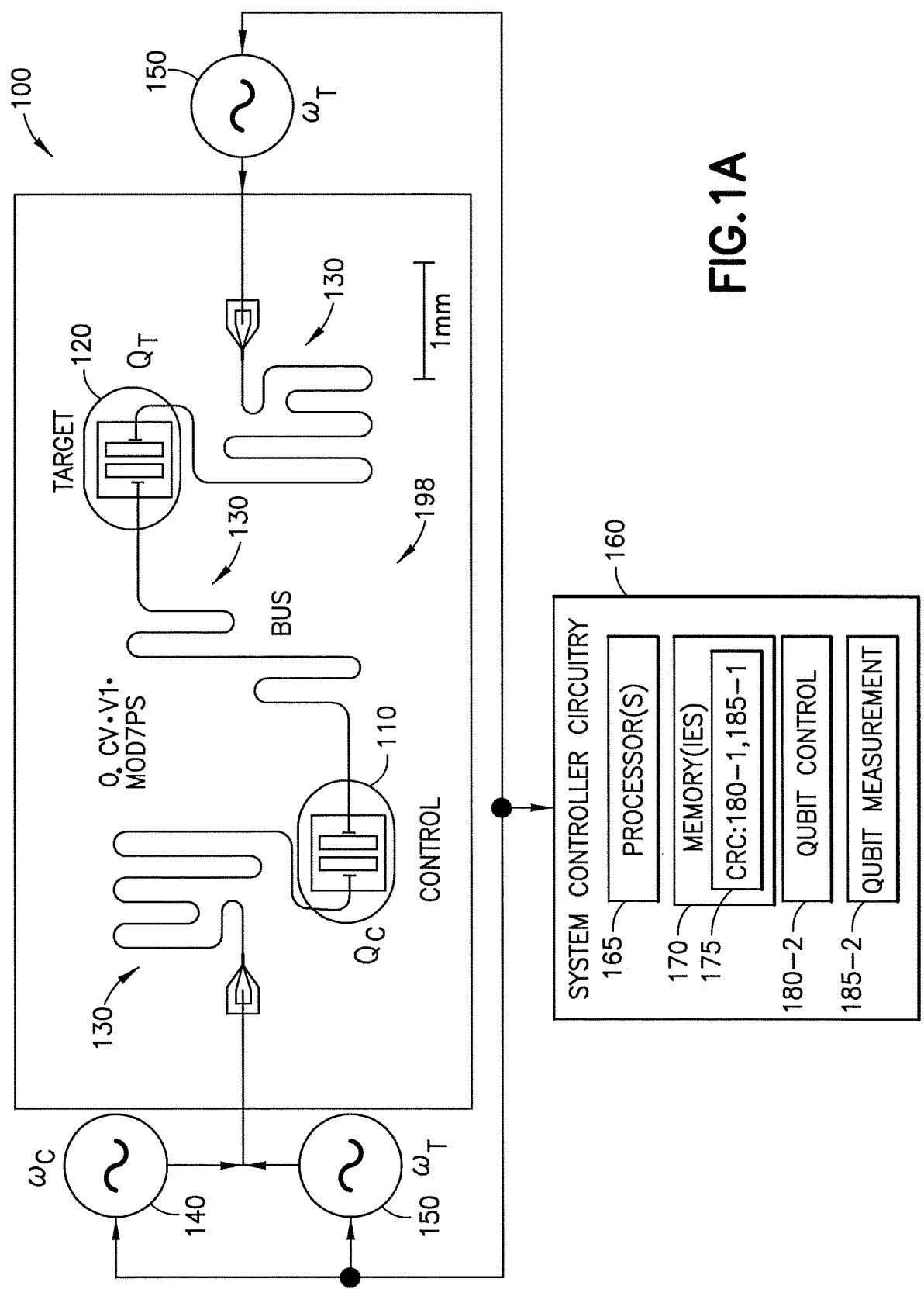
FIG. 1A is a block diagram of a system for performing and using results of a systematic tune up of crosstalk in a cross-resonance gate, in accordance with an exemplary embodiment.
Figure 1B:
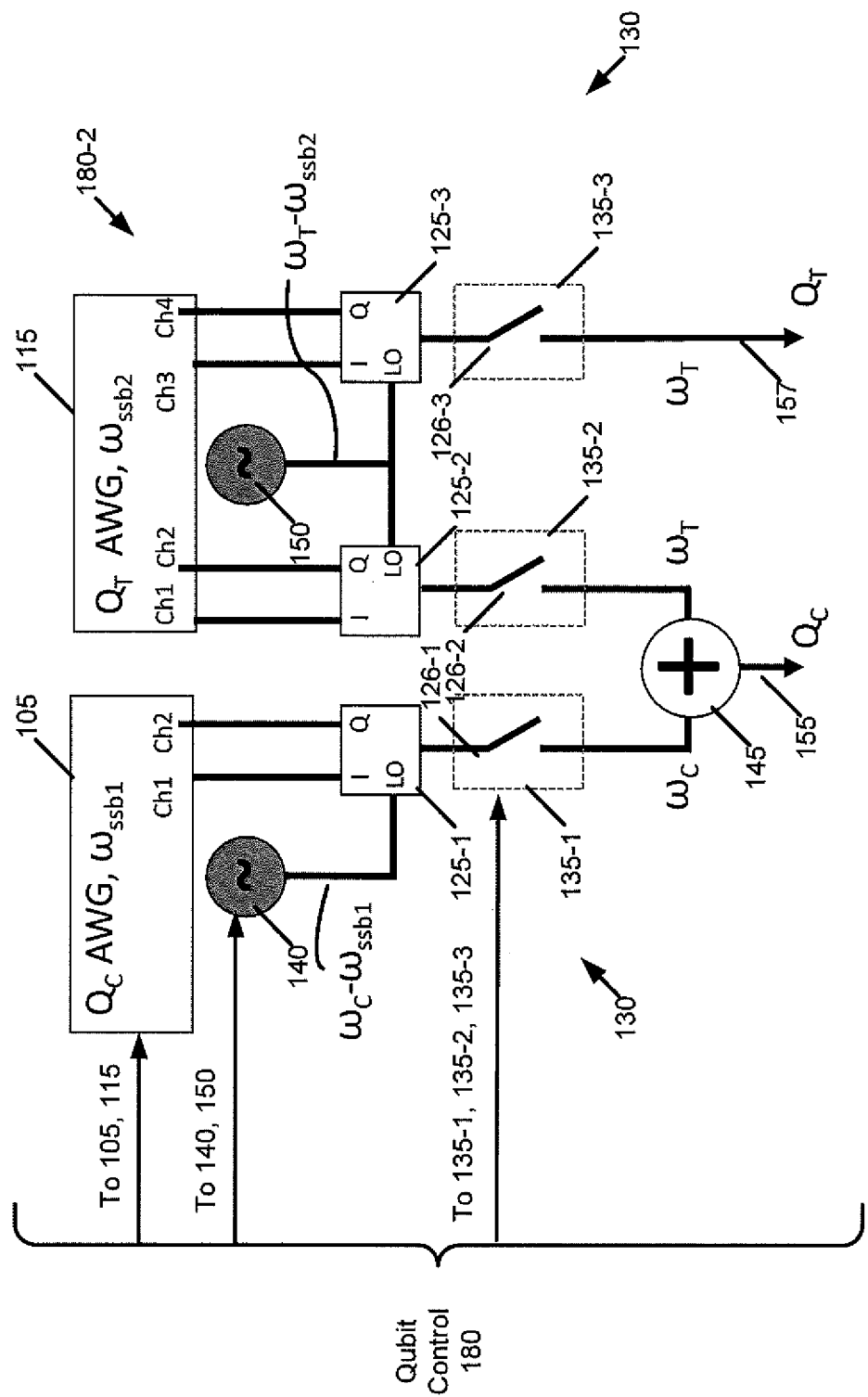
FIG. 1B illustrates part of qubit control circuitry from FIG. 1A.

The system tested and used comprised two fixed-frequency transmon qubits coupled by a bus resonator as shown in FIGS. 1A and 1B. FIG. 1A is a block diagram of a system for performing and using results of a systematic tune up of crosstalk in a cross-resonance gate, in accordance with an exemplary embodiment. FIG. 1B illustrates part of qubit control circuitry from FIG. 1A.

In FIG. 1A, in system 100, there are two qubits, a control qubit ($Q_C$) 110 and a target qubit ($Q_T$) 120, coupled through a bus 130 (also called a bus resonator), which is a superconducting coplanar waveguide resonator. A cross-resonance gate 198 comprises the two qubits 110, 120, and, e.g., the bus 130. There are two RF sources 140 and 150, which are operated using techniques described below. Briefly, both RF sources 140 and 150 are used to excite the control qubit 110, while only the RF source 150 is used to excite the target qubit 120. The system 100 also comprises system controller circuitry 160, which comprises one or more processors 165 and one or more memories 170, which contain computer-readable code (CRC) 175. There are also qubit control 180, possibly split into CRC 180-1 and circuitry 180-2, and qubit measurement 185, also possibly split into CRC 185-1 and circuitry 185-2. In general, qubit control 180 is functionality that causes the system 100 to perform the operations with qubits 110, 120, as such operations are described below. The qubit measurement 185 is functionality that performs measurement operations as described herein. Both the control 180 and measurement 185 may be implemented in part as discrete circuitry 180-2, 185-2, or may be implemented in part as computer-readable code 175 as qubit control 180-1 and qubit measurement 185-1, and the computer-readable code 175 would be executed by the one or more processors 165 to cause the system 100 to perform the respective operations for the qubit control 180-1 and qubit measurement 185-1.

The qubit frequencies are 4.914 GHz (target qubit 120) and 5.114 GHz (control qubit 110) with anharmonicities of −330 MHz for both, and the bus frequency is 6.31 GHz. The coupling between the two qubits is estimated to be $J/2\pi=3.8$ MHz for these parameters. The single-qubit gate fidelities measured with simultaneous randomized benchmarking (see J. M. Gambetta, et al., Phys. Rev. Lett. 109, 240504 (2012)) are 0.9991±0.0002 for the target and 0.9992±0.0002 for control. We characterize the two-qubit gate fidelities in the system by using interleaved randomized benchmarking (RB) (see the following: E. Magesan, et al., Phys. Rev. Lett. 109, 080505 (2012); and J. P. Gaebler, et al., Phys. Rev. Lett. 108, 260503 (2012)). For this measurement, we first find the average fidelity per Clifford in the two-qubit system using standard randomized benchmarking (see E. Magesan, et al., Phys. Rev. A 85, 042311 (2012)), and then repeat the measurement interleaving the CR gate between random Cliffords in the sequence. As is known, fidelity is a measure of how close a gate is to a desired gate, and the higher the fidelity, the closer the implemented gate is to the desired gate. The fidelities are extracted from exponential fits to the average over 35 random sequences each with a total length of 100 Clifford gates. By applying the theoretical Hamiltonian understanding of the teachings below, we were able to benchmark results showing a CR gate fidelity, f=0.991±0.002 for a 160 ns gate. This gate time includes 20 ns added by the single qubit echo, which is buffered by two 10 ns delays. The CR pulses are rounded square pulses with Gaussian rise times of 15 ns.

The critical experimental technique for the improvement of the CR gate is an active cancellation pulse on the target qubit drive to eliminate unwanted interactions of the CR drive Hamiltonian. A circuit to implement the RF signals to the control qubit 110 and the target qubit 120 is illustrated in FIG. 1B. This circuit is part of the qubit control, e.g., part of qubit control circuitry 180-2, and is a view of a portion of the bus 130. This circuitry comprises an arbitrary waveform generator (AWG) 105, which corresponds to the control qubit 110 and has two channels of output (Ch1, Ch2), and AWG 115, which corresponds to the target qubit 120 and has four channels of output (Ch1, Ch2, Ch3, and Ch4). The I/Q mixer 125-1 accepts information from channels Ch1 and Ch2, as I (imaginary) and Q (real) inputs, respectively, from the AWG 105, accepts an RF signal from the RF source 140 (at a frequency of $\omega_C$-$\omega_{ssb1}$) in an LO (local oscillator) connection, and produces an output RF signal 126-1 at frequency $\omega_C$. Similarly, the I/Q mixer 125-2 accepts information from channels Ch1 and Ch2, as I and Q inputs, respectively, from the AWG 115, accepts an RF signal from the RF source 150 (at a frequency of $\omega_T$-$\omega_{ssb2}$) in an LO connection, and produces an output RF signal 126-2 at frequency $\omega_T$. Each frequency $\omega_{ssb1}$ or $\omega_{ssb2}$ is a sideband frequency (ssb stands for "single sideband"), which is the frequency that the pulse is modulated by in the AWG 105 or 115, which then gets mixed with the LO in the corresponding I/Q mixer 125-1 or 125-2 and 125-3 to become a pulse at the corresponding qubit's frequency. The two RF signals 126-1 (at $\omega_C$) and 126-2 (at $\omega_T$) are combined by adder 145 to create a final RF signal 155 that is routed to the control qubit ($Q_C$) 110. The I/Q mixer 125-3 accepts information from channels Ch3 and Ch4, as I and Q inputs, respectively, from the AWG 115, accepts an RF signal from the RF source 150 (at a frequency of $\omega_T$-$\omega_{ssb2}$) in an LO connection, and produces an output RF signal 126-3 at frequency $\omega_T$. There are two switches 135-1, 135-2, which are used to create the waveforms described in reference to FIG. 2 (described below). The switch 135-3 is used to create the waveforms described in reference to FIG. 2. The output of the switch is a final RF signal 157 that is routed to the target qubit ($Q_T$) 120.

The qubit control 180 can configure this circuit as follows. In particular, one may program the system 100 to cause the qubit control 180-1 (the computer readable code) to configure the circuit in FIG. 1B. For instance, the two AWGs 105, 115 can be configured, as can the RF sources 140, 150, and the switches 135-1, 135-2, and 135-3. Any other configuration that is required may also be performed.

Figure 2:
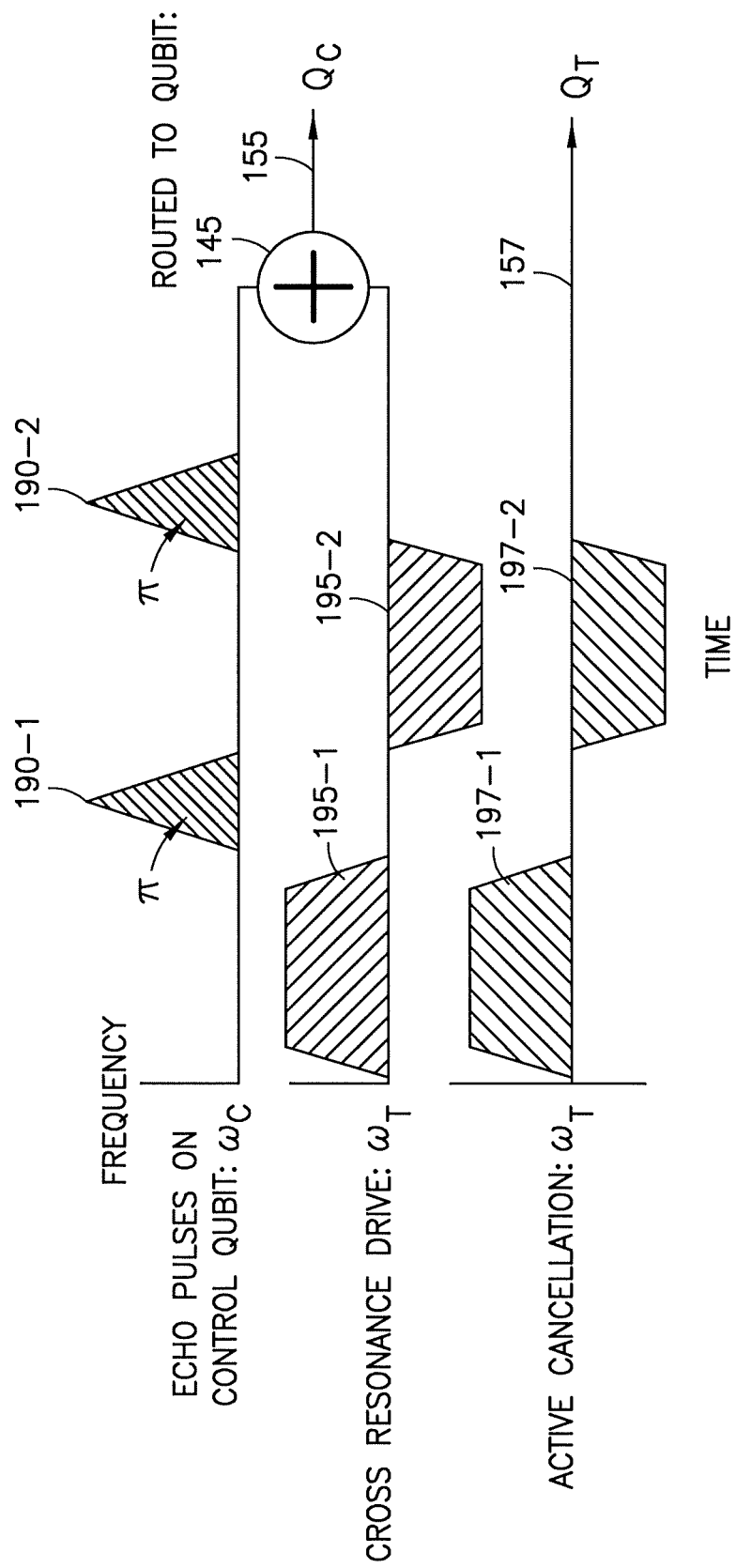
FIG. 2 is a schematic for an echoed CR gate with active cancellation on the target qubit, in accordance with an exemplary embodiment, where the n-pulse on the control is a 20 ns derivative removal via adiabatic gate (DRAG) pulse, and is buffered by two 10 ns delays, and where the CR pulses are flat-topped Gaussian pulses, with $3\sigma$ rise time where $\sigma=5$ ns.

Turning to FIG. 2, this figure is a schematic for an echoed CR gate 198 with active cancellation on the target qubit 120 ($Q_T$), in accordance with an exemplary embodiment. Each of the n-pulses 190-1, 190-2 on the control is a 20 ns derivative removal via adiabatic gate (DRAG) pulse, and is buffered by two 10 ns delays. These are illustrated in FIG. 2 as "Echo pulses on the control qubit: $\omega_C$". As is known, the echo pulses refocus some of the error terms like the ZZ term that is mentioned. The CR pulses 195-1, 195-2 (illustrated as "Cross-resonance drive: $\omega_T$") are flat-topped Gaussian pulses, with 3σ rise time where σ=5 ns. The active cancellation pulses, $\omega_T$, 197-1 and 197-2 are also shown. Without this cancellation tone, the CR gate fidelity for the same gate time is f=0.948±0.018 (e.g., as compared with a CR gate fidelity f=0.991±0.002 with the cancellation tone), demonstrating that the additional drive effectively cancels out the error terms of the CR Hamiltonian. It is noted that the article by C. Rigetti and M. Devoret (Phys. Rev. B 81, 134507

(2010)) provides a good introduction to operation of a two-qubit conventional system.

It is noted that the CR pulses 195 and cancellation pulses 197 have the same analytical form, the same duration, and the same rise/fall time. However, the amplitude and phase of the two pulses will be different (e.g., the point of the calibration described below is to determine the amplitude and phase of the cancellation pulse). The pulse amplitude may be thought of as indicating an envelope around the oscillating carrier tone at the qubit frequencies. Another way of looking at this is that positive amplitude indicates rotation about the +x-axis and negative amplitude indicates rotation about the −x-axis (although it's not necessarily the x-axis, as the exact axis depends on the phase of the pulse). Equivalently, the negative amplitude pulse is exactly π out of phase with the positive amplitude pulse.

Figure 3:
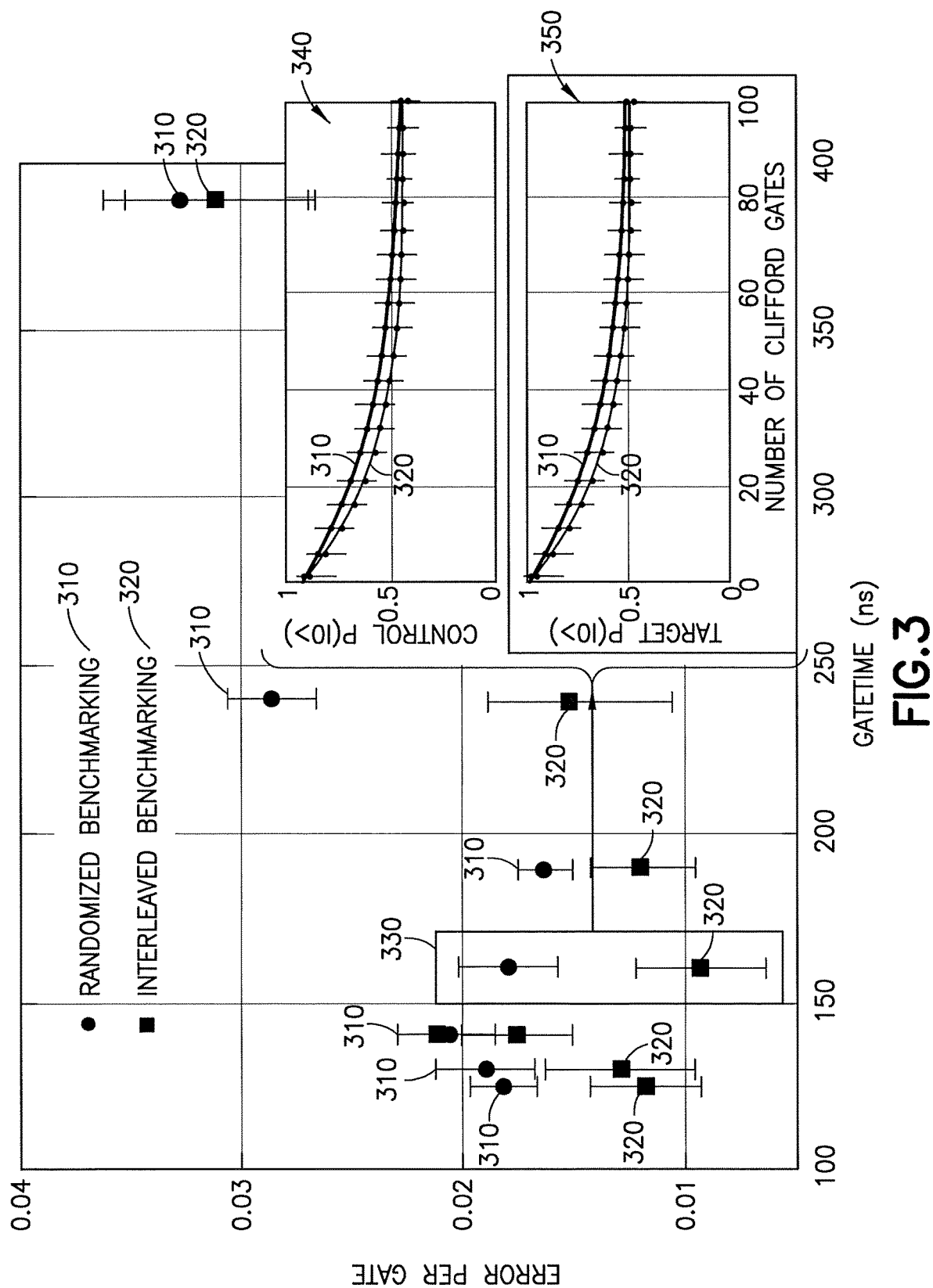
FIG. 3 is graph illustrating an error per gate found by randomized benchmarking (circles) and interleaved randomized benchmarking (squares) as a function of gate time, and where benchmarking decay curves for a highest fidelity point are highlighted in the inset.

Turning to FIG. 3, FIG. 3 is graph illustrating an error per gate found by randomized benchmarking 310 (circles) and interleaved randomized benchmarking 320 (squares) as a function of gate time, and where benchmarking decay curves for a highest fidelity point are highlighted in the inset. In particular, the insets 340 and 350 correspond to the highest fidelity point 330, and illustrate the control P(|0>) (inset 340) and the target P(|0>) (inset 350) versus the number of Clifford gates. We measure the two-qubit gate fidelity as a function of gate time, plotted in FIG. 3 with the RB curves for the gate with the best measured fidelity. The fidelities reported here are calculated by fitting the probability of finding the target qubit in the ground state as a function of the RB sequence length. We have confirmed that the RB decay curves are consistent for both the control and target qubit, and we find that the decay rates are the same within error bars for either measurement. Indeed, at the gate time with lowest error rate, we measure a fidelity of 0.991±0.002 on the target qubit and 0.991±0.003 on the control qubit. The gate time is the duration of the total echoed CR gate including the single-qubit echoing gates. While the fidelities improve as the gate time decreases from 400 ns to 160 ns, shorter gates appear to saturate. We suspect that leakage to higher levels or drive-induced dephasing from the strong two-qubit drive may be the source of this saturation.

The addition of the cancellation drive on the target is the consequence of measurements and simulation of the CR Hamiltonian indicating single-qubit errors that are not fully refocused by the standard CR gate (e.g. the echoed sequence in FIG. 2 without the cancellation pulse on the target qubit). We have developed an effective block-diagonal Hamiltonian model for the system dynamics under a CR drive that reveals the important contributions to the Hamiltonian on the qubit-qubit 4-dimensional subspace. The method finds a unitary operator T that block-diagonalizes the full system Hamiltonian H, $H_{BD}:=T^\dagger HT$, under the constraint that T minimizes the distance to the identity operation $PT-I P_2$ (hence T affects the system as little as possible). The solution for T is given by $$T = X \frac{X_{BD}}{\sqrt{X_{BD} X_{BD}^\dagger}}, \quad (1)$$

where X is the eigenvector matrix of H and is assumed to be non-singular, and $X_{BD}$ is the block-diagonal matrix of X.

In our implementation, the different blocks correspond to the different states of the control qubit and off-resonant (higher energy) qubit subspaces. The model predicts ZX and IX components of similar magnitude, negligible IZ and ZZ contributions, and a large ZI term arising from a Stark shift of the control qubit from off-resonant driving. The complete CR Hamiltonian has the following structure:

$$H = \frac{Z \otimes A}{2} + \frac{I \otimes B}{2}, \quad (2)$$

where A and B are distinct unitary rotations on the target qubit. Note that in this context the operators A and B are used to illustrate the structure of the CR Hamiltonian, and a technique for determining these is described below.

Figure 4A:
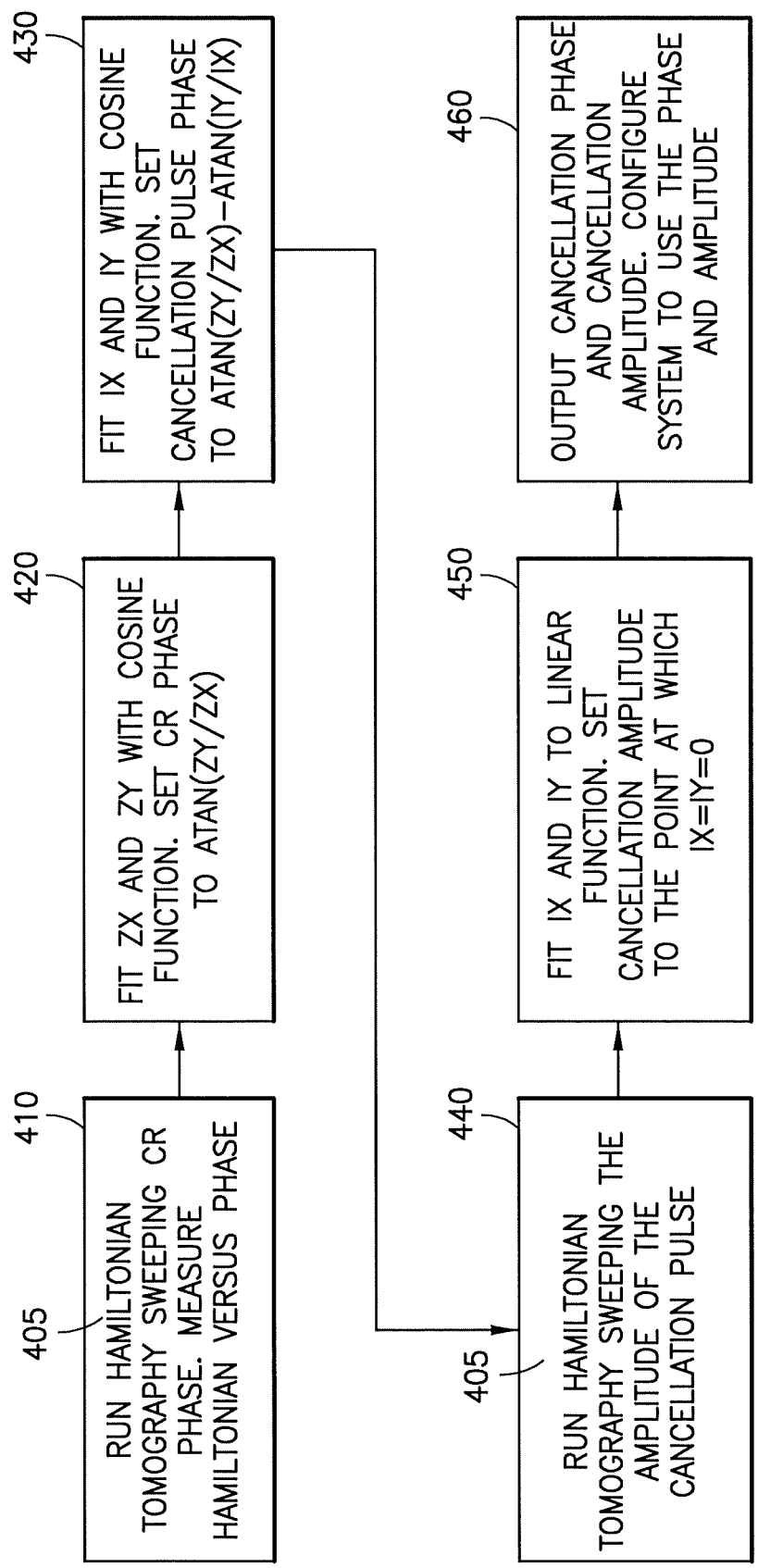
FIG. 4A is a logic flow diagram of a procedure for systematic tune up of crosstalk in a cross-resonance gate and using results of the same, and illustrates the operation of an exemplary method or methods, a result of execution of computer program instructions embodied on a computer readable memory, functions performed by logic implemented in hardware, and/or interconnected means for performing functions in accordance with exemplary embodiments.
Figure 4B:
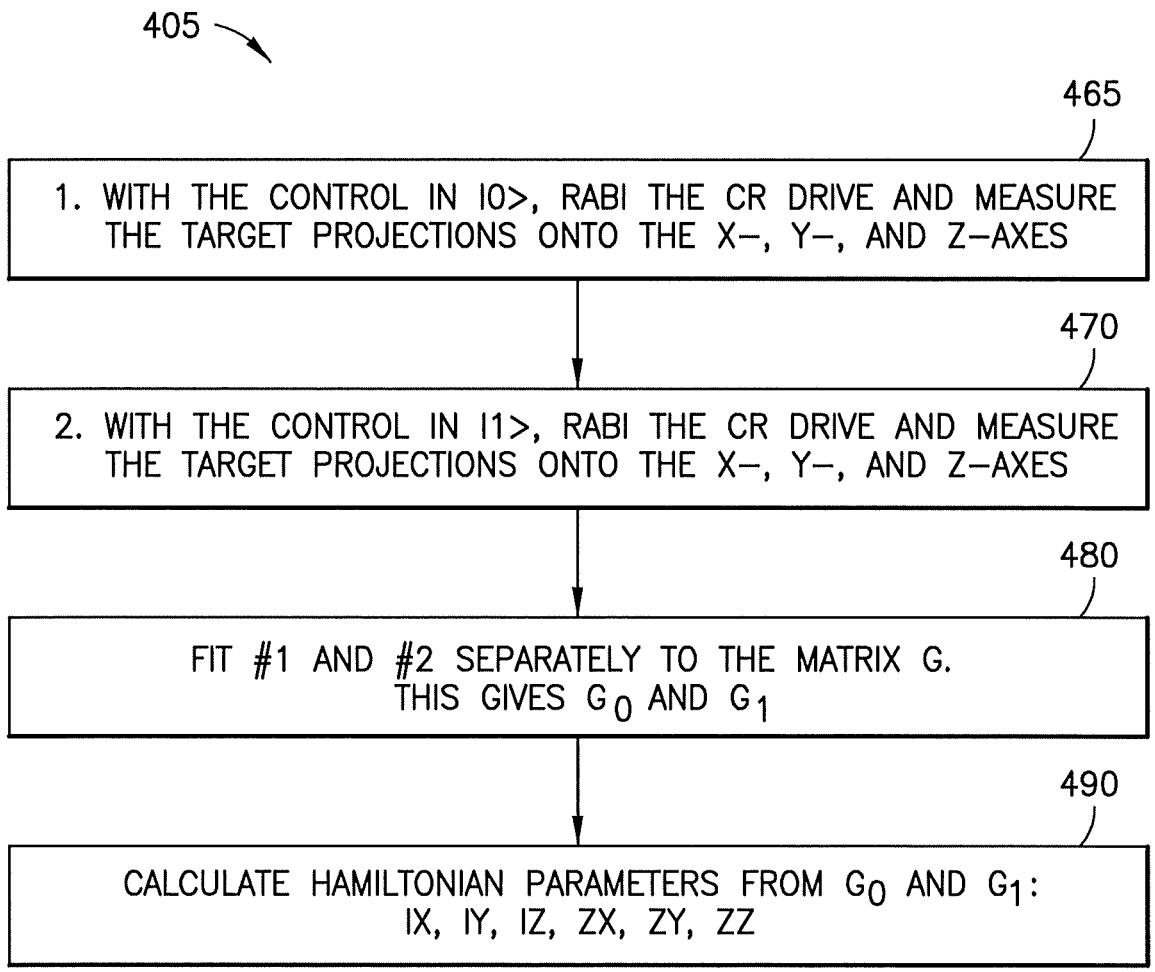
FIG. 4B is a logic flow diagram of part of the procedure of FIG. 4A for performing Hamiltonian tomography, and illustrates the operation of an exemplary method or methods, a result of execution of computer program instructions embodied on a computer readable memory, functions performed by logic implemented in hardware, and/or interconnected means for performing functions in accordance with exemplary embodiments.

Much of the rest of this disclosure is described in reference to FIGS. 4A and 4B. FIG. 4A is a logic flow diagram of a procedure for systematic tune up of crosstalk in a cross-resonance gate and using results of the same, and FIG. 4B is a logic flow diagram of part of the procedure of FIG. 4A for performing Hamiltonian tomography. FIGS. 4A and 4B are performed by system 100, e.g., under control of the qubit control 180 and the qubit measurement 185. These figures illustrate the operation of an exemplary method or methods, a result of execution of computer program instructions embodied on a computer readable memory, functions performed by logic implemented in hardware, and/or interconnected means for performing functions in accordance with exemplary embodiments.

Motivated by this understanding of the CR Hamiltonian, we have developed a protocol for experimentally measuring the CR Hamiltonian that allows us to determine the real error terms in the gate. See block 410 of FIG. 4A, where a Hamiltonian tomography 405 sweeping CR phase is run (e.g., by the system 100 under the control at least in part by the qubit control 180 of FIG. 1), and the Hamiltonian versus phase is measured (e.g., by the system 100 under the control at least in part by the qubit measurement 185 of FIG. 1). It is noted no echo pulses 190 are used in the operations of FIG. 4A. It is noted that for the phrase "sweeping the phase", the procedure is as follows.

1. Set the phase of the CR pulse to zero (and the amplitude of the CR pulse to a specific amplitude).
2. Run Hamiltonian tomography and extract the Hamiltonian for this phase.
3. Increment the phase of the CR pulse to 2π/N.
4. Loop back to #2 N times, until the Hamiltonian has been measured for N CR phases between 0 and 2π.
5. From the Hamiltonian versus phase data, extract the correct phase for the CR pulse and the correct phase for the cancellation pulse (as described in more detail below).

A similar procedure is used for sweeping the amplitude.

Figure 5A:
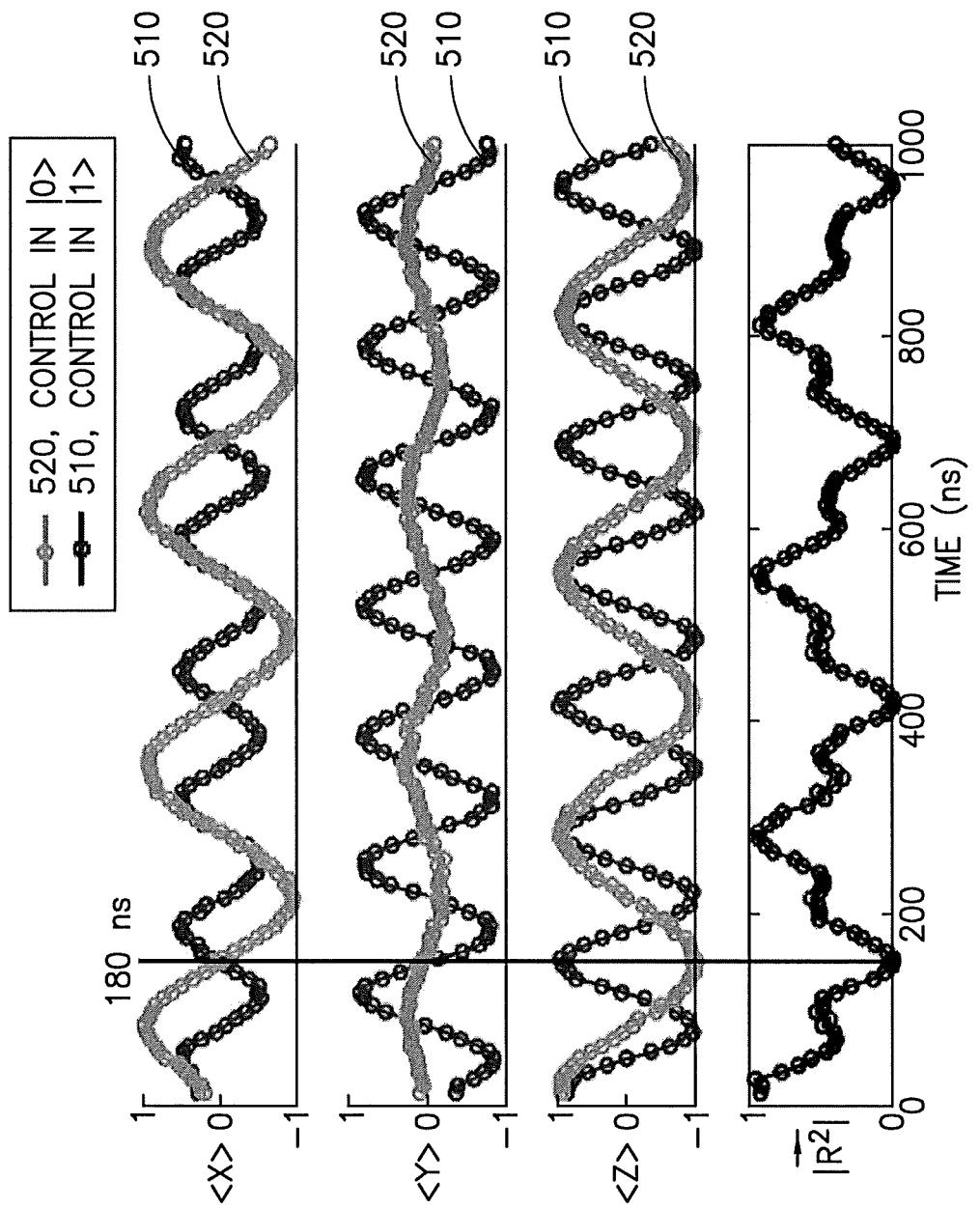
FIG. 5A is a graph of CR Rabi oscillations on the target qubit projected onto x, y, and z for the control in |0> and the control in |1>, where the Bloch vector, R, for the target indicates gate times of maximal entanglement at points when R=0.

The Hamiltonian tomography 405 is shown in more detail in FIG. 4B. For block 410 and the Hamiltonian tomography 405, no cancellation pulses 197 are used (and cancellation pulses 197 are not used in blocks 410, 420, and 430). This experimental measurement of the CR Hamiltonian is accomplished by turning on a CR drive for some time and measuring the Rabi oscillations on the target qubit. The CR drive is the output of the I/Q mixer 125-2. The CR drive is a microwave tone applied to the control qubit at the target qubit's frequency. In this case, the CR drive not pulsed; rather, it is just turned on for some time to measure oscillations on the target. We project the target qubit state onto x, y, and z following the Rabi drive and repeat for the control qubit in |0> and |1> (e.g., the control qubit is initialized in either the |0> or |1> state at the start of the experiment). See block 465, where with the control in |0>, a Rabi experiment is performed by turning on the CR drive and measuring the target projections onto the x-, y-, and z-axes. This operation is also denoted as operation 1. In block 470, with the control in |1>, a Rabi experiment is performed on the CR drive and the target projections onto the x-, y-, and z-axes are measured. This operation is also denoted as operation 2. FIG. 5A contains an example of a complete set of such Hamiltonian tomography experiments. More particularly, FIG. 5A is a graph of CR Rabi oscillations on the target qubit projected onto x, y, and z for the control in |0> and the control in |1>, where the R-vector for the target indicates gate times of maximal entanglement at points when R=0. The last parameter plotted, $P\vec{R}P$, is determined by the Bloch vectors of the target qubit corresponding to the two states of the control qubit and is defined as the following:

$$P\vec{R}P = \frac{1}{2}\sqrt{(\langle X\rangle_0 + \langle X\rangle_1)^2 + (\langle Y\rangle_0 + \langle Y\rangle_1)^2 + (\langle Z\rangle_0 + \langle Z\rangle_1)^2}. \quad (3)$$

When this quantity goes to zero, the two-qubits are maximally entangled (unless the dynamics are completely mixed, but because $P\vec{R}P$ oscillates between zero and one we believe this is not the case). We use $P\vec{R}P$ to estimate the gate length required to perform the entangling gate. We fit the set of Rabi oscillations that correspond to either state (|0> or |1>) of the control qubit separately with a Bloch equation model function:

$$\vec{r}(t) = e^{Gt}\vec{r}(0), \quad (4)$$

with the matrix G defined as the following:

$$\begin{pmatrix} 0 & \Delta & \Omega_y \\ -\Delta & 0 & -\Omega_x \\ -\Omega_y & \Omega_x & 0 \end{pmatrix} \quad (5)$$

Here $\Delta$ is the control drive detuning, and $\Omega_{x,y}$ is the Rabi drive amplitude along $\{x, y\}$. Additionally, $\vec{r}(t)$ is the vector composed of the measured expectation values as a function of the length of the applied Rabi drive, (<X(t)>, <Y(t)>, <Z(t)>), and $\vec{r}(0)$ is $\vec{r}(t)$ at t=0. We find two generators, $G_{\{0,1\}}$, corresponding to the control qubit in either |0> or |1>, respectively, characterized by the terms $\Omega_x^{\{0,1\}}$, $\Omega_y^{\{0,1\}}$, and $\Delta^{\{0,1\}}$. See block 480, where #1 (block 465) and #2 (block 470) are fit separately to the matrix G. This gives $G_0$ and $G_1$. From these terms, we derive the CR drive Hamiltonian in terms of the six possible parameters (see block 490): IX, IY, IZ, ZX, ZY, ZZ. For example, IX=$(\Omega_x^0 + \Omega_x^1)/2$ and ZX=$(\Omega_x^0 - \Omega_x^1)/2$. By measuring the Bloch vectors as a function of time dependent on the state of the control, we can determine the operators A and B of Eq. 2.

Figure 5B:
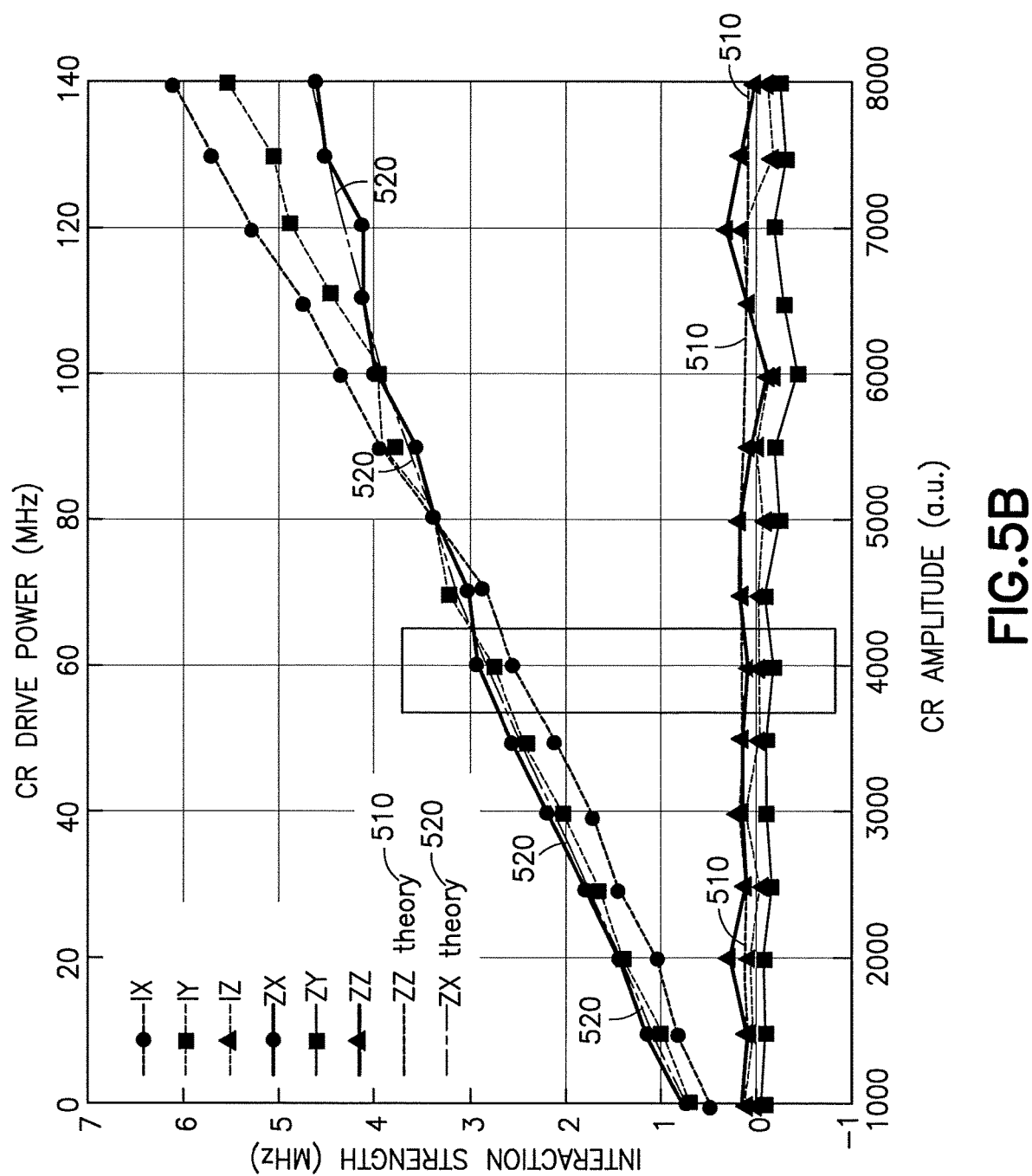
FIG. 5B is a graph of the CR Hamiltonian as a function of the two-qubit drive amplitude including IX (dashed line with circles), IY (dashed line with squares), IZ (dashed line with triangles), ZX (solid line with circles), ZY (solid line with squares), and ZZ (solid line with triangles), where a dot-dashed line and a dotted line correspond to the theory predictions for ZX and ZZ respectively as a function of the CR drive power on the upper x-axis, and where the grey shaded region corresponds to the data from FIG. 5A and later in FIG. 6B.

We can vary the CR drive amplitude, perform the CR-Rabi experiments, and extract the CR Hamiltonian using this Bloch equation fitting method. This provides a measurement of the CR Hamiltonian as a function of the two-qubit drive amplitude, as shown in FIGS. 5A and 5B. It is clear from these figures that parameters IZ and ZZ are small and independent of the drive power. These data were acquired with the CR drive phase set so that the ZY contribution is small and the conditional component of the Hamiltonian consists only of ZX. The measured Hamiltonian parameters are consistent with the ZX and ZZ predicted by the effective Hamiltonian plotted in FIG. 5B. FIG. 5B is a graph of the CR Hamiltonian as a function of the two-qubit drive amplitude including IX (dashed line with circles), IY (dashed line with squares), IZ (dashed line with triangles), ZX (solid line with circles), ZY (solid line with squares), and ZZ (solid line with triangles), where a dot-dashed line 520 and dotted line 510 correspond to the theory predictions for ZX and ZZ respectively as a function of the CR drive power on the upper x-axis, and where the grey shaded region corresponds to the data from FIG. 5A and later in FIG. 6B.

There is an unexpected feature in the experiment as there is also an IY term present when the CR phase is set as above. We attribute this phase difference between conditional and single-qubit terms to classical crosstalk. Although such crosstalk has little effect on simultaneous RB since it is off-resonance, since the CR drive is applied at the frequency of the target qubit, this crosstalk has a significant impact on the two-qubit gate calibration. The standard CR gate is performed using an echo to refocus the parameters IX, ZZ, and ZI, depicted in FIG. 2. The echoed scheme involves a π pulse 190 on the control qubit and a change of sign of the CR drive. If IY terms are present, however, then the echo fails to completely refocus the unwanted interactions. In this case, the IY interaction does not commute with ZX and all higher-order terms of the commutator will be on during the two-qubit gate.

Figure 6A:
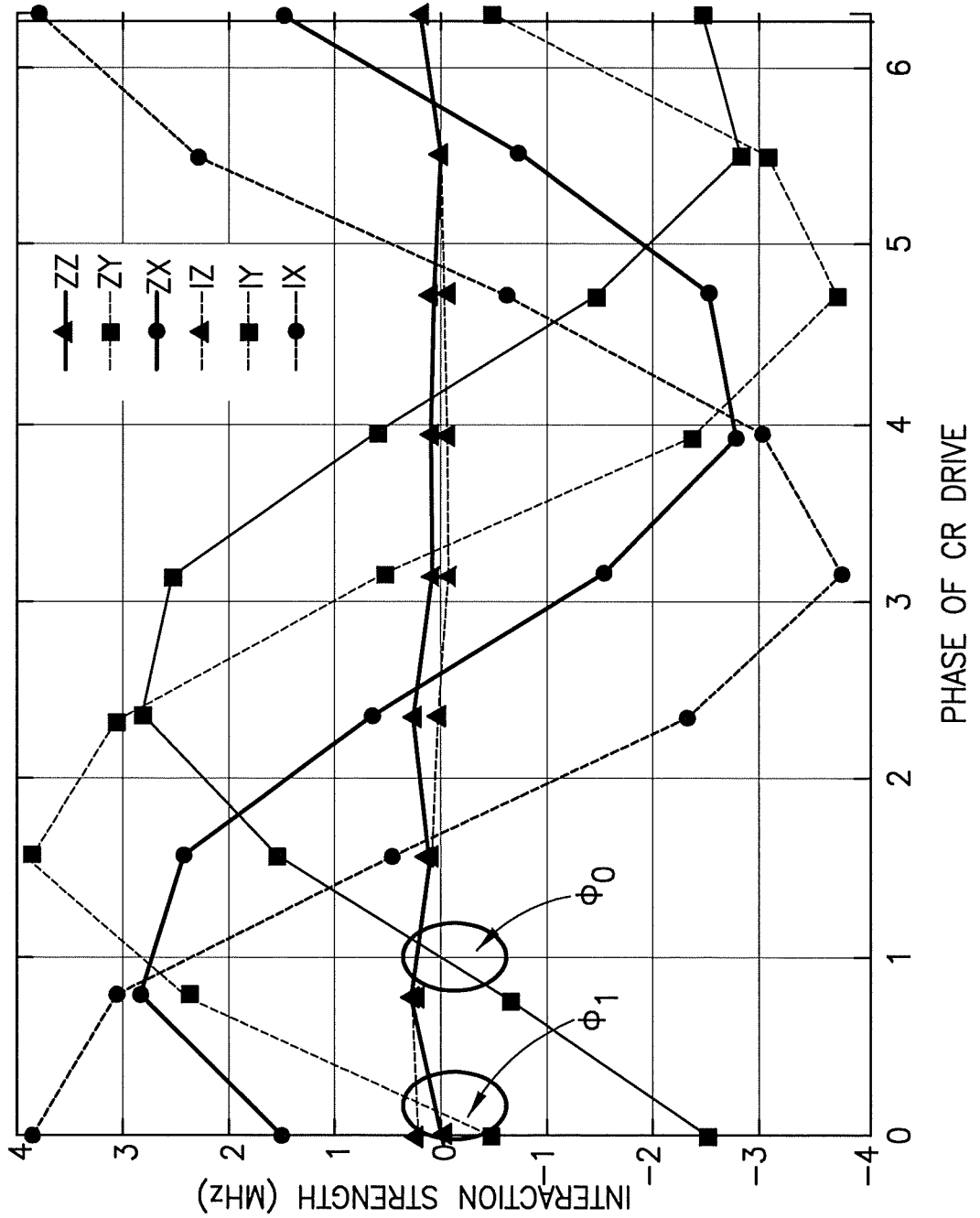
FIG. 6A is a graph of CR Hamiltonian parameters as a function of the drive phase: ZZ (solid line with triangles), ZY (solid line with squares), ZX (solid line with circles), IZ (dashed line with triangles), IY (dashed line with red squares), IX (dashed line with circles)

The gate calibration procedure is based on these Hamiltonian measurements. Ultimately, the goal is to tune up a $ZX_{90}$, which is a generator of a controlled-NOT (CNOT) with single-qubit Clifford rotations. The first step is to find the Hamiltonian parameters as a function of the phase of the CR drive (see FIG. 6A). We use FIG. 6A to find the CR phase (in radians), $\phi_0$ at which the ZX component is maximized and ZY is zero. The phase is changed by shifting the sideband phase that modulates the pulse on the AWG. See block 420 of FIG. 4A, where ZX and ZY are fit with a cosine function. The CR phase is fixed to a tan(ZY/ZX), which is $\phi_0$.

With the CR phase fixed at $\phi_0$, the two-qubit drive produces nonzero IX and IY components. We find the phase, $\phi_1$, at which the single-qubit component, IY, is zero. The correct phase for the cancellation pulse is $\phi=\phi_0-\phi_1$, at which phase the single-qubit drive on the target matches $\tan^{-1}$(IY/IX) for the two-qubit drive. See block 430 of FIG. 4A, where IX and IY are fit with a cosine function.

Figure 6B:
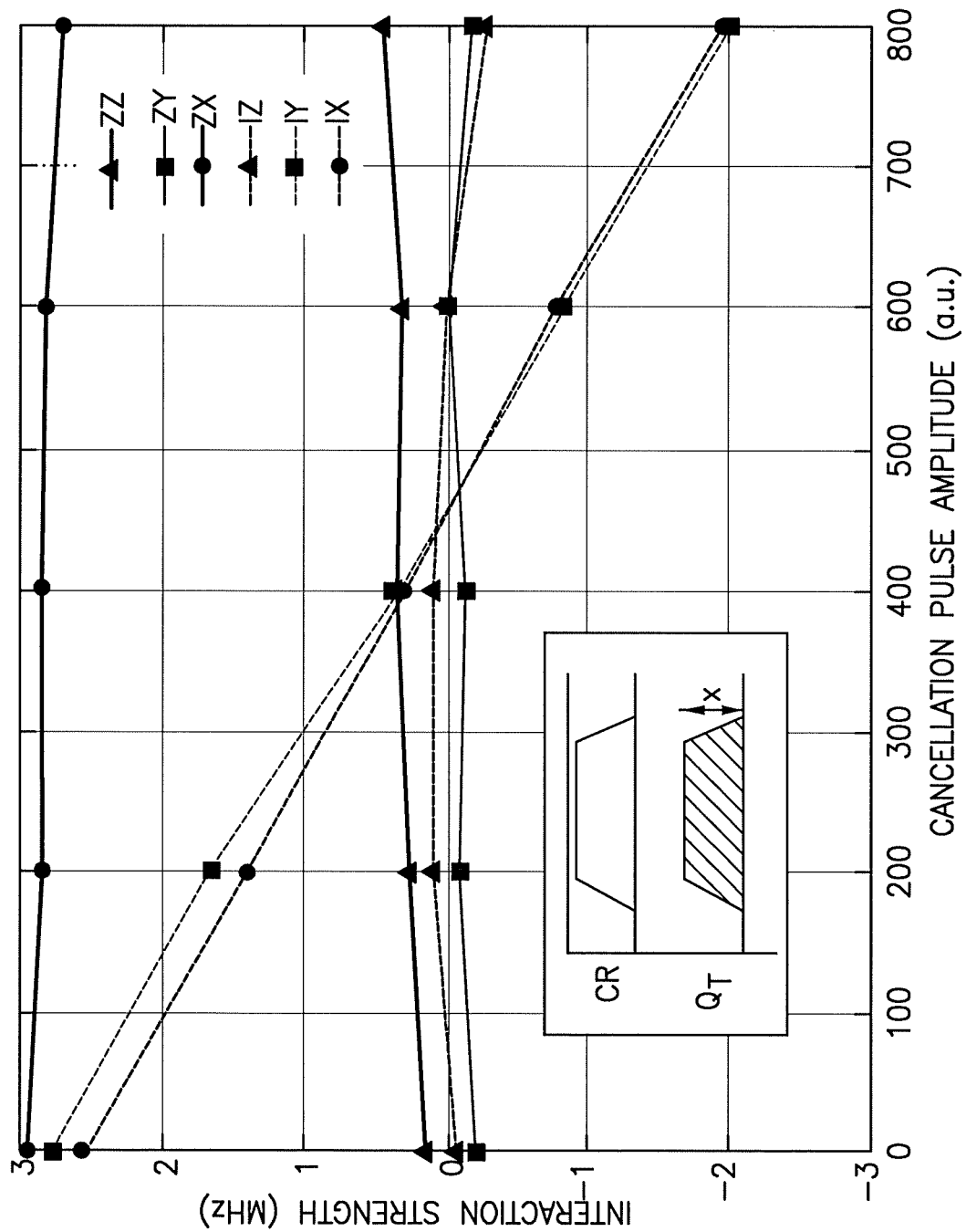
FIG. 6B is a graph of the same Hamiltonian parameters plotted versus the active cancellation pulse amplitude (x, as shown in the pulse schematic in the inset), where the CR amplitude for these data corresponds to that of the shaded region in FIG. 5B.

The second step is to set the cancellation pulse to the correct amplitude for canceling $\cos(\phi)$IX+$\sin(\phi)$IY. See block 430 of FIG. 4A, where the cancellation pulse phase is set to a tan(ZY/ZX)-a tan(IY/IX). Again we measure the CR Hamiltonian, this time sweeping the cancellation pulse amplitude as shown in FIG. 6B. This is illustrated by block 440 of FIG. 4A, where Hamiltonian tomography 405 is (re)run, sweeping the amplitude of the cancellation pulse 197. In block 450 of FIG. 4A, IX and IY are fit to a linear function. The cancellation amplitude is set to the point at which IX=IY=0. If the parameters IX and IY are not zero at the same cancellation amplitude (x in the schematic shown in FIG. 6B), then the cancellation phase is incorrect.

In block 460 of FIG. 4A, the cancellation phase and cancellation amplitude for the cancellation pulse 197 (see FIG. 1) are output, e.g., for subsequent use by and operation of the system 100. The system 100 may therefore be configured to use the cancellation phase and amplitude for the cancellation pulse 197.

Figure 7:
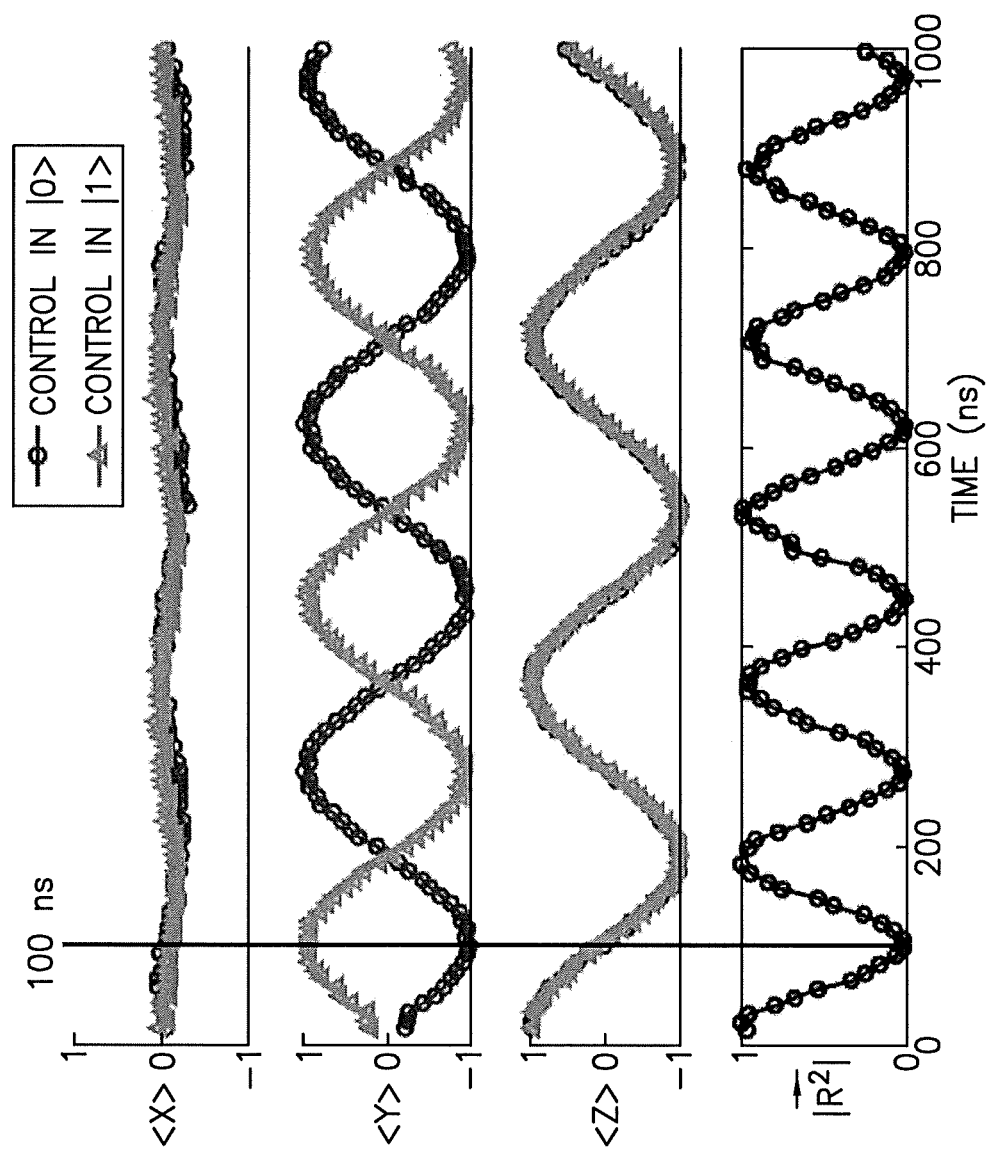
FIG. 7 is a graph illustrating CR Rabi experiments as a function of the CR pulse width after calibrating the active cancellation amplitude and phase, where from top to bottom are the expectation values <X>, <Y>, and <Z>, and the Bloch vector of the target qubit, R.

The CR-Rabi oscillations on the target qubit with the fully calibrated cancellation pulse (FIG. 7) are much closer to the oscillations expected for a ZX drive. From FIG. 7, we see that the entangling gate is significantly faster than previous cross-resonance gates; the R-vector goes to zero at 100 ns for the particular CR amplitude used. This is slightly slower than the entangling time of 83 ns that is predicted by the ZX rate, which we attribute to the rise time of the pulse. The echoed gate time of 160 ns is consistent with the R-vector measurement as it includes the additional single qubit gate and the rise and fall of both halves of the CR echo. Additionally the oscillations of $\|\vec{R}\|$ are sinusoidal, unlike in FIG. 5A. If the cancellation were perfect, there would be no oscillation of <X>, and <Y> oscillations would have full contrast.

Figure 8:
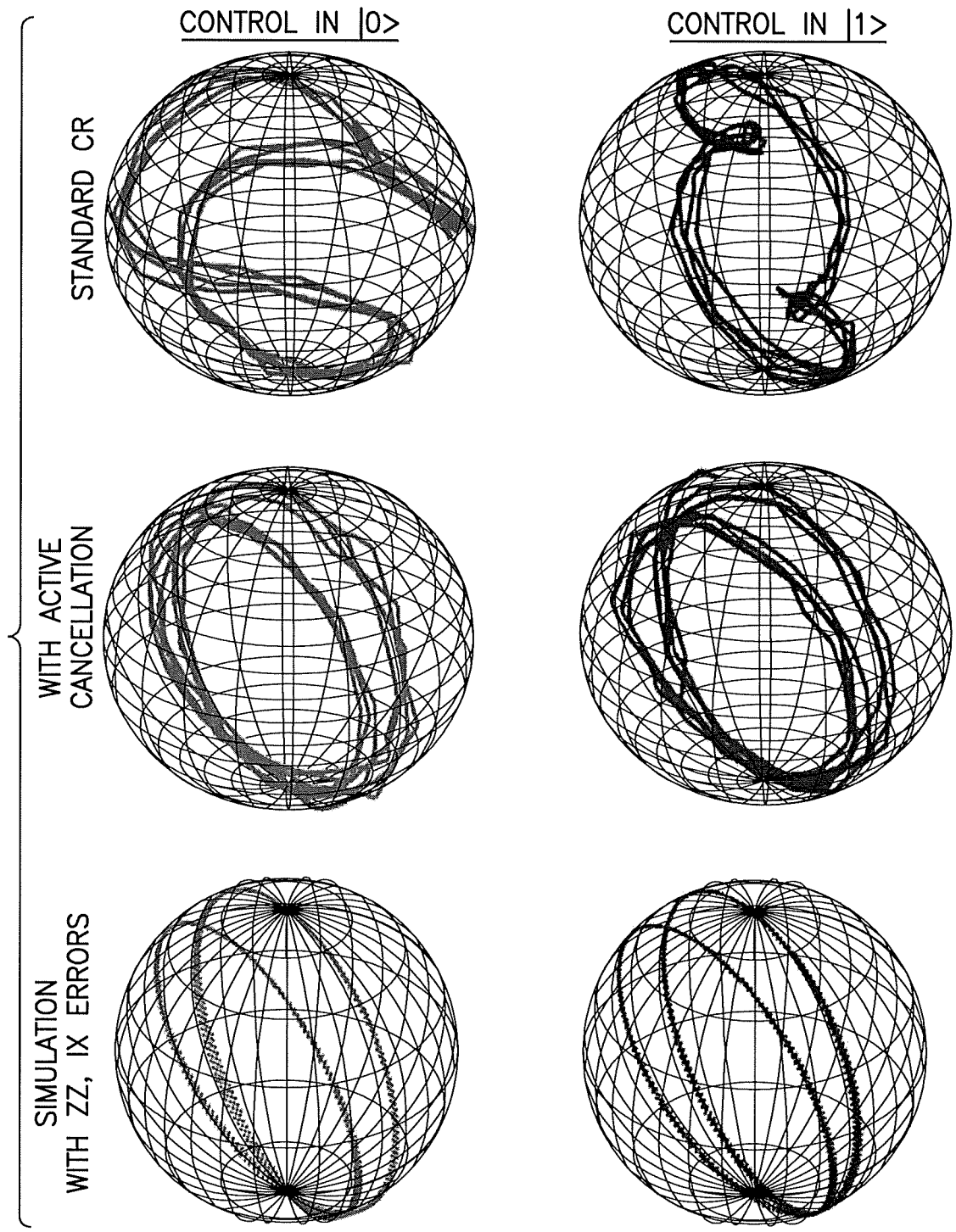
FIG. 8 contains plots of the target qubit state on the Bloch sphere during evolution during the echoed cross-resonance gate, where the left column is the target state when the control is in |1>, with the right side corresponding to the control in |1>, where each of the rows are as follows: the top row illustrates echoed cross-resonance gate with no active cancellation, the middle row illustrates echoed cross-resonance gate with active cancellation on the target qubit, and the bottom row illustrates simulations of the echoed cross-resonance with small IZ and IX errors on the two-qubit drive.

Plotting the same data on the Bloch sphere, as in FIG. 8, we can see the trajectory of the target qubit during the CR gate. As is known, on the Bloch sphere, |0> is the north pole, and |1> is the south pole. The Bloch sphere picture does not work well for a two-qubit system, where the basis states are |00>, |01>, |10>, and |11>. FIG. 8 therefore is really showing a subset of the full two qubit space, so the spheres on the left indicate the state trajectory of the target qubit when the control qubit is fixed in state |0> while the spheres on the right indicated the target qubit state trajectories when the control is fixed in |1>. The data in the top row of FIG. 8 show the target trajectory when the two-qubit echoed gate is applied with no active cancellation pulse. A perfect ZX gate would result in a circle on the surface of the Bloch sphere, but the echoed CR gate creates a more convoluted path on the Bloch sphere before an entangling gate is achieved. When the cancellation pulse is added (middle row), the picture is qualitatively closer to the ideal circle on the Bloch sphere, but still some error remains. Comparing to a simulated echoed gate (bottom row), we find that the residual error is consistent with a ZZ on the order of the ZZ error we measure in the calibration sweeps and an order of magnitude smaller IX.

While the measured fidelity is higher than previously reported fidelities for CR two-qubit gates, it is still not yet limited by coherence. The limit placed on the fidelity by $T_1$ (38±2 μs/41±2 μs for the control/target) and $T_2$ (50±4 μs/61±6 μs) for the two-qubits is 0.996. There is evidence from studies of single-qubit gates that drive-activated dephasing may be a limiting factor for the error rates of gates at similar drive powers (see the following: S. Sheldon, et al., Phys. Rev. A 93, 012301 (2016); and H. Ball et al., ArXiv e-prints (2016), arXiv:1602.04551 [quant-ph]). Even so, it appears from the CR Rabi data that coherent errors have not been fully eliminated in the CR gate.

While it is clear that some coherent errors remain on the cross-resonance gate, the inclusion of an active cancellation tone has produced a dramatic improvement in the two-qubit gate fidelity. The calibration procedure that we have developed has provided insight into the full CR Hamiltonian, and revealed that a single-qubit phase shift due to crosstalk (either classical or quantum) is a significant source of error in the echoed CR gate. Future work might focus on shortening the gate times further by tuning up a CR gate without an echo and developing faster and more robust calibration procedures.

These improvements to the microwave-driven CR gate are encouraging for a quantum computing architecture built out of fixed-frequency qubits. With greater knowledge of the CR Hamiltonian, we are confident that further improvements can be made to reduce the two-qubit gate time and increase fidelity.

Note that the previously described method of Hamiltonian tomography is applicable to any system with a Hamiltonian with the same form as Eq. 2. In addition, due to the symmetry of H, this method scales efficiently for an n-qubit system, since there are n(n−1)/2 different control/target qubit pairs and each pair requires six Rabi measurements described above.

As an example, we can extend the Hamiltonian tomography method to measure the effects of crosstalk from neighboring qubits in multi-qubit system. For instance, in a system with three qubits, there is a control qubit, a target qubit, and a spectator qubit. The spectator qubit should do nothing during the two qubit gate that is applied between the control and target qubits. Since all the qubits are coupled, however, the spectator qubit can cause additional Z errors on the target qubit. We can measure these errors by performing Hamiltonian tomography with an additional step of measuring the Hamiltonian when the spectator qubit is in both |0> and |1> states. In this case, there are 12 total Rabi experiments: three projections of the target qubit for the cases of (1) control in |0> and spectator in |0>, (2) control in |1> and spectator in |0>, (3) control in |0> and spectator in |1>, and (4) control in |1> and spectator in |1>.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following abbreviations that may be found in the specification and/or the drawing figures are defined as follows:
AWG arbitrary waveform generator
a tan arctangent ($\tan^{-1}$ (□))
a.u. arbitrary units
BD block-diagonal
CNOT controlled-NOT
CR cross-resonance
CRC computer-readable code
DRAG derivative removal via adiabatic gate
GHz gigahertz
LO local oscillator
MHz megahertz
ns nanoseconds
RB randomized benchmarking
RF radio frequency
ssb single sideband

What is claimed is:

1. A method, comprising:
generating, in a system comprising a cross-resonance gate having a superconducting control qubit and having a superconducting target qubit coupled through a bus resonator, echo pulses at a first frequency and directing the echo pulses to the control qubit, wherein the first frequency is on resonance with the control qubit;
generating cross-resonance pulses at a second frequency on resonance with the target qubit and applying the cross-resonance pulses to the control qubit, wherein the generating and applying the cross-resonance pulses induce rotations on the target qubit through an interaction that is mediated by the bus resonator; and
generating cancellation pulses at the second frequency and applying the cancellation pulses to the target qubit, wherein the applying the cancellation pulses to the target qubit is configured using amplitude, phase, rise/fall times, and duration of the cancellation pulses to reduce interactions of a cross-resonance drive Hamiltonian, wherein the amplitude and phase of the cancellation pulses were determined using the cross resonance pulses and were determined prior to the applying the cancellation pulses to the target qubit.

2. The method of claim 1, wherein both the cross-resonance pulses and the cancellation pulses are flat-topped Gaussian pulses that are generated to overlap in time, with 3σ rise/fall times, wherein the cross-resonance pulses have the same rise/fall times as the cancellation pulses and the cross-resonance pulses have a same duration as the cancellation pulses.

3. The method of claim 1, wherein the cancellation pulses have had the amplitude and the phase previously determined, prior to the applying the cancellation pulses to the target qubit, through a process to reduce coherent errors and increase cross resonance gate fidelity, wherein the process ran Hamiltonian tomography by sweeping both amplitude and phase of the cancellation pulses to meet criteria, the meeting of which indicates the coherent errors are reduced and the cross resonance gate fidelity is increased.

4. The method of claim 1, wherein the amplitude and the phase of the cross-resonance pulses have been previously determined prior to at least the generating and applying the cross-resonance pulses.

5. The method of claim 1, wherein the cancellation pulses have a phase and an amplitude and wherein the method further comprises performing a calibration procedure to determine the phase and the amplitude prior to performing the generating the cancellation pulses at the second frequency and the applying the cancellation pulses to the target qubit.

6. The method of claim 5, wherein performing the calibration procedure comprises:
measuring, in the system, a first set of Hamiltonian tomographies, where cross-resonance pulses at a frequency on resonance with the target qubit are applied to the control qubit, and where Hamiltonian tomographies of the first set are measured at specific points as the cross-resonance pulses are swept from a beginning phase to an ending phase at a specific amplitude;
determining, using output from the first set of Hamiltonian tomographies, the phase to be used for the cancellation pulses;
measuring a second set of Hamiltonian tomographies by applying the cross-resonance pulses at the frequency to the control qubit and applying cancellation pulses at the frequency and at the determined phase to the target qubit, where the cross-resonance pulses have a specific amplitude and a specific phase, where Hamiltonian tomographies are measured at specific points as a test amplitude of the cancellation pulses is swept from a beginning amplitude to an ending amplitude;
determining, using output from the second set of Hamiltonian tomographies, the amplitude to be used for the cancellation pulses; and
outputting the determined phase and determined amplitude for the cancellation pulses.

7. An apparatus, comprising:
a system comprising a cross-resonance gate having a superconducting control qubit and having a superconducting target qubit coupled through a bus resonator;
system controller circuitry comprising one or more processors and one or memories having computer readable code, wherein the one or more processors, in response to retrieving and executing the computer readable code, cause the system to perform operations comprising:
generating, in the system, echo pulses at a first frequency and directing the echo pulses to the control qubit, wherein the first frequency is on resonance with the control qubit;
generating cross-resonance pulses at a second frequency on resonance with the target qubit and applying the cross-resonance pulses to the control qubit, wherein the generating and applying the cross-resonance pulses induce rotations on the target qubit through an interaction that is mediated by the bus resonator; and
generating cancellation pulses at the second frequency and applying the cancellation pulses to the target qubit, wherein the applying the cancellation pulses to the target qubit is configured using amplitude, phase, rise/fall times, and duration of the cancellation pulses to reduce interactions of a cross-resonance drive Hamiltonian, wherein the amplitude and phase of the cancellation pulses were determined using the cross-resonance pulses and were determined prior to the applying the cancellation pulses to the target qubit.

8. The apparatus of claim 7, wherein both the cross-resonance pulses and the cancellation pulses are flat-topped Gaussian pulses that are generated to overlap in time, with $3\sigma$ rise/fall times, wherein the cross-resonance pulses have the same rise/fall time as the cancellation pulses and the cross-resonance pulses have a same duration as the cancellation pulses.

9. The apparatus of claim 7, wherein the cancellation pulses have had the amplitude and the phase previously determined, prior to the applying the cancellation pulses to the target qubit, through a process to reduce coherent errors and increase cross resonance gate fidelity, wherein the process ran Hamiltonian tomography by sweeping both amplitude and phase of the cancellation pulses to meet criteria, the meeting of which indicates the coherent errors are reduced and the cross resonance gate fidelity is increased.

10. The apparatus of claim 7, wherein the amplitude and the phase of the cross-resonance pulses have been previously determined prior to at least the generating and applying the cross-resonance pulses.

11. The apparatus of claim 7, wherein the cancellation pulses have a phase and an amplitude and wherein the one or more processors, in response to retrieving and executing the computer readable code, further cause the system to perform operations comprising: performing a calibration procedure to determine the phase and the amplitude prior to performing the generating cancellation pulses at the second frequency and the applying the cancellation pulses to the target qubit.

12. The apparatus of claim 11, wherein performing the calibration procedure comprises:
measuring, in the system, a first set of Hamiltonian tomographies, where cross-resonance pulses at a frequency on resonance with the target qubit are applied to the control qubit, and where Hamiltonian tomographies in the first set are measured at specific points as the cross-resonance pulses are swept from a beginning phase to an ending phase at a specific amplitude;
determining, using output from the first set of Hamiltonian tomographies, the phase to be used for the cancellation pulses;
measuring a second set of Hamiltonian tomographies by applying the cross-resonance pulses at the frequency to the control qubit and applying cancellation pulses at the frequency and at the determined phase to the target qubit, where the cross-resonance pulses have a specific amplitude and a specific phase, where Hamiltonian tomographies are measured at specific points as a test amplitude of the cancellation pulses is swept from a beginning amplitude to an ending amplitude;
determining, using output from the second set of Hamiltonian tomographies, the amplitude to be used for the cancellation pulses; and
outputting the determined phase and determined amplitude for the cancellation pulses.

13. A method, comprising:
measuring, in a system comprising a cross-resonance gate having a superconducting control qubit and a superconducting target qubit coupled through a bus resonator, a first set of Hamiltonian tomographies, where cross-resonance pulses at a frequency on resonance with the target qubit are applied to the control qubit, and where Hamiltonian tomographies of the first set are measured at specific points as the cross-resonance pulses are swept from a beginning phase to an ending phase at a specific amplitude;

determining, using output from the first set of Hamiltonian tomographies, a phase to be used for cancellation pulses;

measuring a second set of Hamiltonian tomographies by applying the cross-resonance pulses at the frequency to the control qubit and applying the cancellation pulses at the frequency and at the determined phase to the target qubit, where the cross-resonance pulses have a specific amplitude and a specific phase, where Hamiltonian tomographies are measured at specific points as an amplitude of the cancellation pulses is swept from a beginning amplitude to an ending amplitude;

determining, using output from the second set of Hamiltonian tomographies, an amplitude to be used for the cancellation pulses; and outputting the determined phase and amplitude for the cancellation pulses, to be used to configure the system for subsequent operations of the cross-resonance gate.

14. The method of claim 13, further comprising configuring the system with the determined phase and amplitude for the cancellation pulses, and using the system to change state of the cross-resonance gate from a first state to a second state.

15. The method of claim 13, wherein measuring the first or second sets of Hamiltonian tomographies further comprises the following operations, for each measured Hamiltonian tomography:

with control in |0>, Rabi the cross-resonance drive and measure first target projections onto x-, y-, and z-axes;

with control in |1>, Rabi the cross-resonance drive and measure second target projections onto x-, y-, and z-axes;

fit the first target projections that have been projected onto the x-, y-, and z-axes to a first matrix;

fit the second target projections that have been projected onto the x-, y-, and z-axes to a second matrix; and calculate Hamiltonian parameters from the first and second matrices.

16. The method of claim 15, wherein:

each of the first and second matrices is a matrix G defined as the following:

$$\begin{pmatrix} 0 & \Delta & \Omega_y \\ -\Delta & 0 & -\Omega_x \\ -\Omega_y & \Omega_x & 0 \end{pmatrix},$$

where $\Delta$ is a control drive detuning, and $\Omega_{x,y}$ is a Rabi drive amplitude along $\{x, y\}$, respectively;

the matrix G is used in a Bloch equation model function:

$$\vec{r}(t) = e^{Gt}\vec{r}(0),$$

where $\vec{r}(t)$ is a vector composed of measured expectation values as a function of the length of an applied Rabi drive, $(<X(t)>, <Y(t)>, <Z(t)>)$, and $\vec{r}(0)$ is $\vec{r}(t)$ at t=0; and the calculated Hamiltonian parameters are IX, IY, IZ, ZX, ZY, ZZ.

17. The method of claim 13, wherein determining a phase to be used for the cancellation pulses comprises:

determining Hamiltonian parameters ZX and ZY, and determining a phase, $\phi_0$ at which the ZX component is maximized and ZY is zero;

with the phase of the cross-resonance pulses fixed at $\phi_0$, where the cross-resonance gate produces nonzero IX and IY components, finding a phase, $\phi_1$, at which a single-qubit component, IY, is zero; and determining the phase for the cancellation pulses as $\phi = \phi_0 - \phi_1$.

18. The method of claim 17, wherein:

determining a phase, $\phi_0$ at which the ZX component is maximized and ZY is zero further comprises fitting the parameters ZX and ZY with a cosine function and setting the phase $\phi_0$ to a tan(ZY/ZX); and finding the phase, A, at which a single-qubit component, IY, is zero further comprises fitting the parameters IX and IY with a cosine function and setting the phase $\phi_1$ to a tan(IY/IX).

19. The method of claim 17, wherein determining an amplitude to be used for the cancellation pulses further comprises fitting the parameters IX and IY to a linear function and setting the amplitude to a point at which IX=IY=0.

20. The method of claim 13, wherein the system further comprises a spectator qubit, and the spectator qubit does nothing during application of a two qubit gate between the control and target qubits, and the method further comprises measuring errors caused by the spectator qubit by measuring additional Hamiltonian tomographies when the spectator qubit is in either of the |0> state or |1> state, wherein a total of 12 total Rabi experiments are performed, as per the following: (1) three projections of the target qubit for the case of control in |0> and spectator in |0>; (2) three projections of the target qubit for the case of control in |1> and spectator in |0>, (3) three projections of the target qubit for the case of control in |0> and spectator in |1>; and (4) three projections of the target qubit for the case of control in |1> and spectator in |1>.

* * * * *